United States Patent [19]

Shoemaker et al.

[11] Patent Number: 4,906,873

[45] Date of Patent: Mar. 6, 1990

[54] CMOS ANALOG FOUR-QUADRANT MULTIPLIER

[75] Inventors: Patrick A. Shoemaker, Lemon Grove; Gene L. Haviland; Isaac Lagnado, both of San Diego, all of Calif.

[73] Assignee: The United States of America as represented by the Secretary of the Navy, Washington, D.C.

[21] Appl. No.: 297,452

[22] Filed: Jan. 12, 1989

[51] Int. Cl.$^4$ .................... H03L 5/00; H03K 19/01
[52] U.S. Cl. .................... 307/498; 328/160; 363/60; 307/482; 307/578; 307/264
[58] Field of Search ............ 307/110, 264, 497, 498, 307/529, 482, 578, 270, 246; 328/160; 363/60

[56] References Cited

U.S. PATENT DOCUMENTS

| | | | |
|---|---|---|---|
| 3,727,078 | 4/1973 | Wollensen | 307/529 |
| 4,071,777 | 1/1978 | Hermann | 328/160 |
| 4,101,966 | 7/1978 | Uzunoglu | 328/160 |
| 4,156,924 | 5/1979 | Lampe et al. | 307/498 |
| 4,366,550 | 12/1982 | Lampe | 364/844 |
| 4,546,275 | 10/1985 | Penna Finol et al. | 307/498 |
| 4,563,670 | 1/1986 | Stallkamp et al. | 340/347 DA |
| 4,586,155 | 4/1986 | Gilbert | 364/841 |
| 4,623,890 | 11/1986 | Nysen | 342/44 |

OTHER PUBLICATIONS

"Modeling of an Ion-Implanted Silicon-Gate Depletion-Mode IGFET", by Huang, J. S. T. et al., IEEE Transactions on Electron Devices, vol. ED-22, pp. 995–1001, Nov. 1975.

"A Precise Four-Quadrant Multiplier with Subnanosecond Response", by Gilbert, B., IEEE Journal of Solid State Circuits, vol. SC-3, No. 4, pp. 365–373, Dec. 1968.

Primary Examiner—Stanley D. Miller
Assistant Examiner—Richard Roseen
Attorney, Agent, or Firm—Harvey Fendelman; Thomas Glenn Keough; Michael A. Kagan

[57] ABSTRACT

A four-quadrant analog multiplier circuit provides an output which is proportional to two voltage inputs. The circuit includes a pair of depletion mode transistors having gain constants equal in magnitude and threshold voltages equal in magnitude. The gates of the transistors are coupled in common. One input is applied to the common gates. The other input and its inverse are separately applied to source/drain terminals of the two transistors.

8 Claims, 7 Drawing Sheets

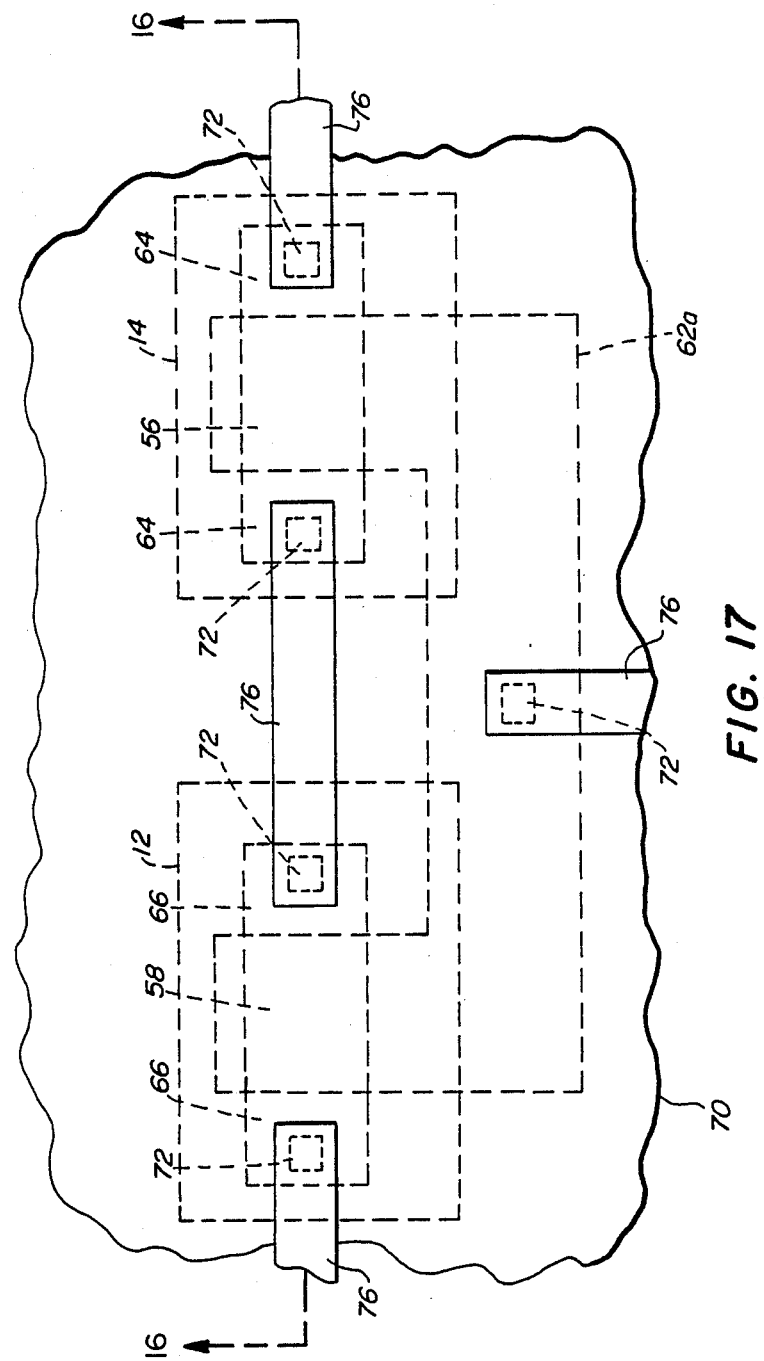

CMOS ANALOG FOUR-QUADRANT MULTIPLIER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention relates to the field of multiplier circuits, and more particularly, to the field of four-quadrant analog multiplier circuits.

Analog multiplier circuits form important building blocks for devices such as adaptive filters, function generators, and modulators. In the emerging field of artificial neural networks, implementation of useful network structures in analog integrated circuitry will in many cases require large arrays of multipliers. Some designs for analog four-quadrant multiplication MOS circuitry existing to date are based upon the characteristics of MOS transistors in saturation. See Soo, D.C., and Meyer, R.G., ."A Four-Quadrant NMOS Analog Multiplier," *IEEE J. Solid-State Circuits,* vol. SC-17, pages 1174–1178, December 1982; and Bult, K., and Wallinga, H., "A CMOS Four-Quadrant Analog Multiplier", *IEEE J. Solid-State Circuits,* vol. SC-21, pages 430–435, June 1986. However, these circuits typically require twenty to forty transistors to provide a practical working circuit. Another type of four-quadrant multiplier circuit is taught in U.S. Pat. No. 4,071,777, "Four-Quadrant Multiplier" by Herrmann, Jan. 31, 1978. Herrmann's basic circuit includes two enhancement mode transistors and requires separate DC bias voltages applied to each of two transistor gates as well as voltage inputs representing the multiplicands, resulting in a complicated circuit.

Still another four-quadrant multiplier circuit is taught by Enomoto, J., et al., "Integrated MOS Four-Quadrant Analog Multiplier Using Switched Capacitor Technology For Analog Signal Processor IC's," *IEEE Journal of Solid-State Circuits,* Vol. SC-20, No. 4, August 1985. Enomoto teaches the use of two enhancement mode transistors biased in the linear or triode region in combination with a difference amplifier to perform four-quadrant multiplication. However, this device disadvantageously requires circuitry to compute the difference in currents flowing through the two transistors.

Therefore, a need exists for a four-quadrant multiplier having a minimal number of transistors and which does not require application of bias voltages to each transistor gate or inclusion of amplifiers within the circuit.

SUMMARY OF THE INVENTION

The invention includes a complementary pair of n- and p-channel depletion mode transistors. The gates of each transistor are connected in common and receive voltage input $V_1$. Second voltage input $V_2$ and its inverse $-V_2$ are also provided to the circuit. In the case where $V_2 > 0$, $V_2$ is provided to the terminal of the n-channel transistor which acts as the drain and $-V_2$ is provided to the terminal of the p-channel transistor which acts as the drain. The terminals of each transistor which act as sources are connected at an output node. In the case where $V_2 > 0$, then $V_2$ and $-V_2$ are applied to the same physical terminals as in the first case, however, these two terminals become the sources of the two transistors due to the difference in polarity of the applied voltages from those of the first case. In the latter case, the two terminals which are connected at the output node become the drains of the two transistors. In either case, the circuit provides an output proportional to the product $(V_1V_2)$.

The invention provides a simple four terminal transistor circuit which achieves four-quadrant multiplication and requires no bias voltages to actuate the transistors. The inputs, $V_1$ and $V_2$, can be applied directly to the transistors. The simplified circuit makes the invention suitable for use in large arrays expected to be found in artificial neural networks.

OBJECTS OF THE INVENTION

A first object of the present invention is to provide a four-quadrant analog multiplier requiring only four terminals.

A second object of the present invention is to provide a four-quadrant analog multiplier suitable for use in arrays.

A third object of the present invention is to provide a four-quadrant analog multiplier which outputs a current proportional to two input voltages.

A fourth object of the present invention is to provide a four-quadrant analog multiplier which outputs a voltage proportional to two input voltages.

BRIEF DESCRIPTION OF THE DRAWINGS

FIG. 17 illustrates a plan view of the wafer.

DESCRIPTION OF THE PREFERRED EMBODIMENT

Figure 1:
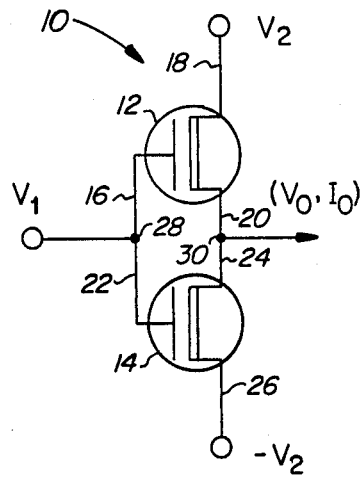
FIG. 1 is a schematic diagram of a four-quadrant analog multiplier circuit.

FIG. 1 depicts a schematic diagram of multiplier circuit 10, comprising a pair of complementary depletion-mode MOS transistors, 12 and 14. N-channel transistor 12 includes gate 16, terminal 18, and terminal 20. P-channel transistor 14 includes gate 22, terminal 24 and terminal 26. Gate 16 is connected to gate 22 at node 28. Terminal 20 is connected to terminal 24 at output node 30.

In multiplier circuit 10, the substrates (not shown) of transistors 12 and 14 are either electrically isolated, or biased in such a way as to insure reverse-bias across p-n junctions under all operating conditions. A voltage $V_1$ is applied to gates 16 and 22 through node 28. A second voltage $V_2$ is applied to terminal 18 of transistor 12 (n-channel). The inverse of voltage $V_2$, i.e., $-V_2$, is applied to terminal 26 of transistor 14 (p-channel).

Operation of multiplier circuit 10 assumes transistors 12 and 14 follow the first order approximation for drain current through a MOSFET presented below:

$$I_d = \mu C_{ox} W/L [(V_{gs} - V_t)V_{ds} - \tfrac{1}{2} V_{ds}^{2b}] \quad 1$$

where $I_d$ is the drain current (taken as positive into the drain), $V_{gs}$ is the gate-to-source voltage, $V_{ds}$ is the drain-to-source voltage, $V_t$ is the threshold voltage, $\mu$ is the channel mobility, $C_{ox}$ is the capacitance per unit area across the gate oxide of the transistor, and W and L are the width and length, respectively, of the channel of the transistor.

The respective gain constants, $K_n$ and $K_p$, for n-channel transistor 12 and p-channel transistor 14, each represented by the expression $\mu C_{ox} W/L$, are assumed to be matched in magnitude where:

$$-K_n = K_p = K, \quad 2$$

where $K > 0$, and the respective depletion-mode threshold voltages $V_{tn}$ and $V_{tp}$ are assumed to be likewise matched where:

$$-V_{tn} = V_{tp} = V_T, \quad 3$$

and where $V_T > 0$, the subscripts n and p represent n-channel and p-channel transistors 12 and 14, respectively, and $V_T$ represents the design threshold voltage magnitude of transistors 12 and 14.

Figure 2:
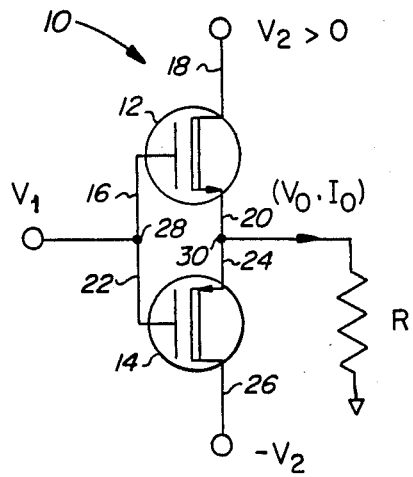
FIG. 2 is a schematic diagram of the present invention in operation where $V_2 > 0$.

Operation of multiplier circuit 10 for the case in which $V_2 > 0$ is illustrated in FIG. 2. Substitution of the voltages $V_1$, $V_2$, and $-V_2$, indicated in FIG. 1, and of the parameters K and $V_T$, defined in equations 2 and 3, into Eqn. (1) yields the following expressions for the drain currents $I_{dn}$ and $I_{dp}$ of n- and p- channel transistors 12 and 14, respectively:

$$I_{dn} = K[(V_1 - V_o + V_T)(V_2 - V_o) - \tfrac{1}{2}(V_2 - V_o)^2] \quad 4.1$$

$$I_{dp} = -K[(V_1 - V_o - V_T)(-V_2 - V_o) - \tfrac{1}{2}(-V_2 - V_o)^2] \quad 4.2$$

The output current is expressed as:

$$I_o = I_{dn} + I_{dp}, \quad 4.3$$

which upon substitution of the expressions for $I_{dn}$ and $I_{dp}$ of Eqns. (4.1) and (4.2) into Eqn. (4.3), and solving for $I_o$ yields:

$$I_o = 2K(V_1 V_2 - V_T V_o). \quad 5$$

Figure 3:
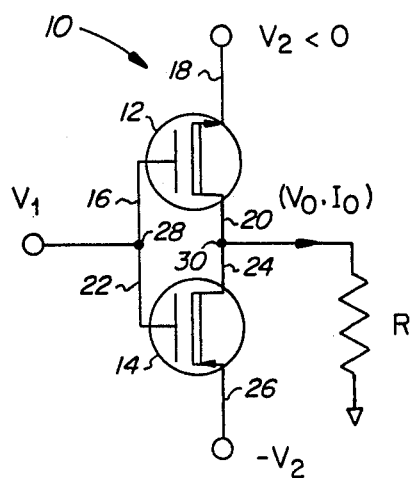
FIG. 3 is a schematic diagram of the present invention in operation where $V_2 < 0$.

The case for $V_2 > 0$ is illustrated in FIG. 3. The equations giving the currents flowing through transistors 12 and 14 become:

$$I_{dn} = K[(V_1 - V_2 + V_T)(V_o - V_2) - \tfrac{1}{2}(V_0 - V_2)^2] 6.1$$

$$I_{dp} = -K[(V_1 + V_2 - V_t)(V_o + V_2) - \tfrac{1}{2}(V_0 + V_2)^2]. \quad 6.2$$

In this case $$I_o = -(I_{dn} + I_{dp}), \quad 6.3$$

whereby substituting the expressions for $I_{dn}$ and $I_{dp}$ of Eqns. (6.1) and (6.2) into Eqn. (6.3) yields Eqn. (5) for the output current, $I_o$, thus demonstrating four quadrant operation of multiplier circuit 10.

Figure 4:
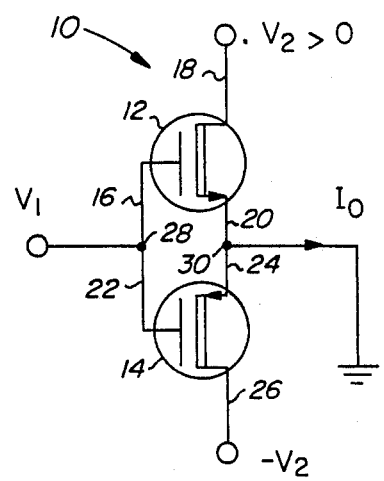
FIG. 4 is a schematic diagram of the present invention operating in a short-circuit output to ground mode.
Figure 5:
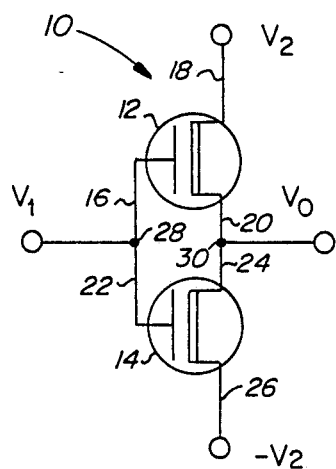
FIG. 5 is a schematic diagram of the present invention operating in an open circuit mode.

In the case of short-circuit output to ground depicted in FIG. 4, the output current can be expressed as:

$$I_o = 2KV_1 V_2 \text{(short circuit output current} \quad 7$$

and in the case of open-circuit output depicted in FIG. 5, the output voltage, $V_o$, may be expressed as:

$$V_o = (1/V_T) V_1 V_2 \text{ (open circuit output voltage)}. \quad 8$$

When a resistive load, R, is placed between the output and ground, as shown in FIG.'s 2 or 3, the output current $I_o$ becomes:

$$I_o = [2K/(1 + 2K V_T R)] V_1 V_2 \text{(resistive load to ground)} \quad 9$$

The following conditions must be satisfied to assure that transistors 12 and 14 operate within their linear regions:

$$V_{gs} - V_{tn} < V_{ds} \text{(n-channel device)} \quad 10.1$$

$$V_{gs} - V_{tp} < V_{ds} \text{(p-channel device)}. \quad 10.2$$

These inequalities can be shown to be satisfied if the operating ranges of $V_1$ and $V_2$ are restricted such that:

$$|V_1| + |V_2| < V_T.$$

Figure 6:
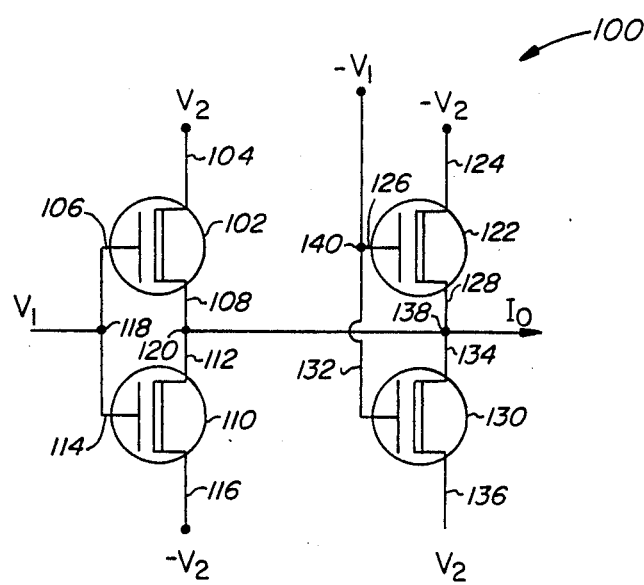
FIG. 6 is a second embodiment of the present invention which eliminates output errors attributable to mismatches in threshold voltages between the n- and p-channel transistors.

Circuit 10 should be constructed with gain constants $K_n$ and $K_p$ of transistors 12 and 14, respectively, being matched in magnitude, and with threshold voltages $V_{tn}$ and $V_{tp}$, of transistors 12 and 14, respectively, being matched in magnitude. However, such matching is difficult to achieve. Mismatches between gain constants $-K_n$ and $K_p$, and between threshold voltages $V_{tn}$ and $V_{tp}$ will result in deviations from Equation (9). Multiplication errors introduced by such deviations can be reduced by a second embodiment of the present invention, circuit 100, schematically illustrated in FIG. 6 and which is described below.

N-channel depletion mode transistor 102 having terminal 104, gate 106 and terminal 108 is operably coupled to p-channel depletion mode transistor 110 having terminal 112, gate 114, and terminal 116. Gates 106 and 114 are operably coupled at node 118. Terminal 108 is connected to terminal 112 at node 120. Circuit 100 includes second n-channel depletion mode transistor 122 having terminal 124, gate 126, and terminal 128; and second p-channel depletion mode transistor 130 having gate 132, terminal 134, and terminal 136. Terminal 128 is operably coupled to terminal 134 at node 138. Gate 132 is operably coupled to gate 126 at node 140. Node 120 is operably coupled to node 138.

Figure 6A:
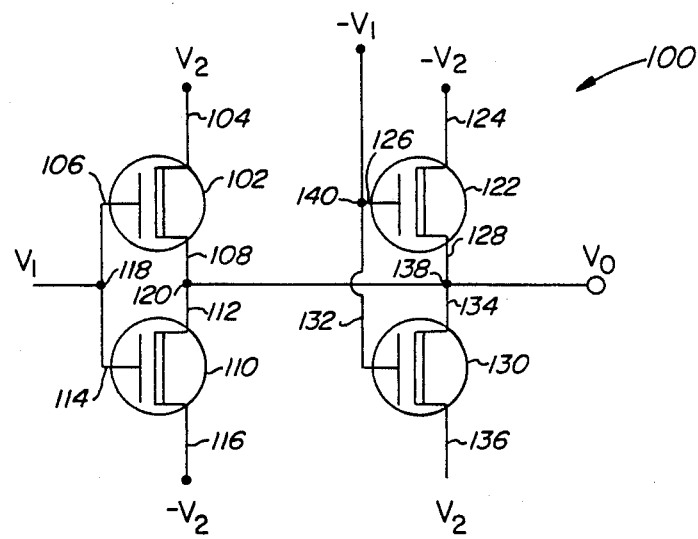
FIG. 6A is a schematic diagram of the present invention operating in an open circuit mode.
Figure 6B:
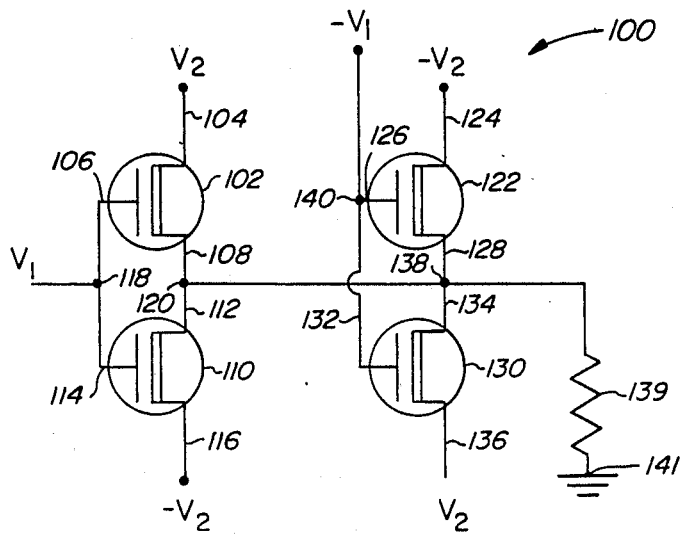
FIG. 6B is a schematic diagram of the present invention operating with a resistive load electrically coupled between the output node and ground so that the output of the invention may be detected as a current.

In the operation of circuit 100, $V_1$ is applied to node 118; $V_2$ is applied to terminals 104 and 136; $-V_1$ is applied to node 140; and $-V_2$ is applied to terminals 116 and 124. The output of circuit 100 may be detected as a voltage, $V_O$, or as a current, $I_O$. For example, output voltage $V_O$ may be detected where the invention is operated in an open circuit mode, as depicted in FIG. 6A. The output of circuit 100 may be detected as current $I_O$, as for example, where circuit 100 is operated with resistive load 139 electrically coupled between node 138 and ground 141, as depicted in FIG. 6B.

CONSTRUCTION OF THE INVENTION

Construction of four-quadrant analog multiplier circuit 10 may be accomplished through standard deposition, implant, and photolithographic techniques as described below by way of example and as illustrated in FIG.'s 7-17, inclusive. These techniques may also be employed to construct circuit 100. For ease of reference, the assembly which is subjected to the manufacturing steps described below and which results in a completed circuit 10 is referred to as wafer 49.

Figure 7:
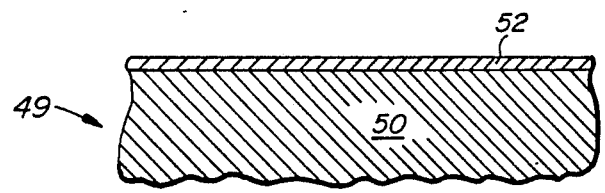
FIG. 7 depicts a thin film of semiconductor material deposited on an insulating substrate.

Referring to FIG. 7, the present invention is formed on insulating substrate 50 having a thin layer of semiconductor material 52 deposited thereon. The structure comprising semiconductor material 52 deposited on substrate 50 is available commercially and may be, for example, silicon on sapphire, as is well known by those skilled in this technology. In the preferred embodiment of the present invention semiconductor material 52 comprises a 300 nanometer layer of silicon film.

Figure 8:
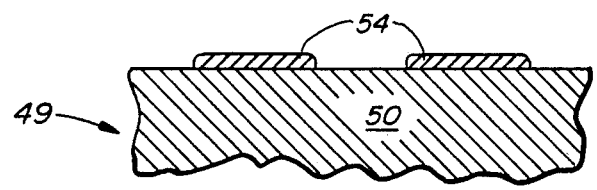
FIG. 8 depicts semiconductors islands formed on the insulating substrate.
Figure 9:
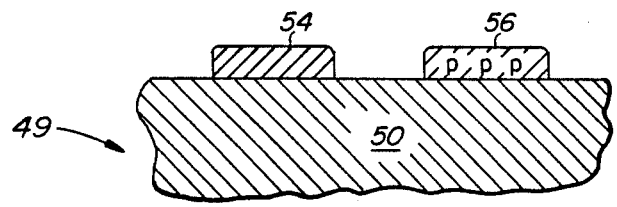
FIG. 9 depicts an island doped with p-type dopant.
Figure 10:
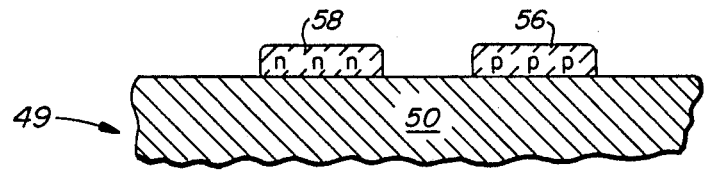
FIG. 10 depicts an island doped with n-type dopant.

Referring to FIG. 8, semiconductor material 52 is etched through standard photolithographic techniques to produce semiconductor islands 54. Those islands 54 which are to become n-channel transistors then are masked. Doped region 56 of p-type material is formed in semiconductor islands 54 as shown in FIG. 9. This may be accomplished by masking islands 54 which are to doped with n-type dopant and subjecting remaining islands 54 to ion implantation with p-type dopant such as boron. Islands 54 and 56 next are oxidized to a depth that assures an approximately 100 nanometer thick layer of unoxidized silicon is present at the end of the process. Islands 56 are masked and those islands 54 which are not doped with p-type dopant then are implanted with n-type dopant such as arsenic to create n-type implanted islands 58 as shown in FIG. 10.

Figure 11:
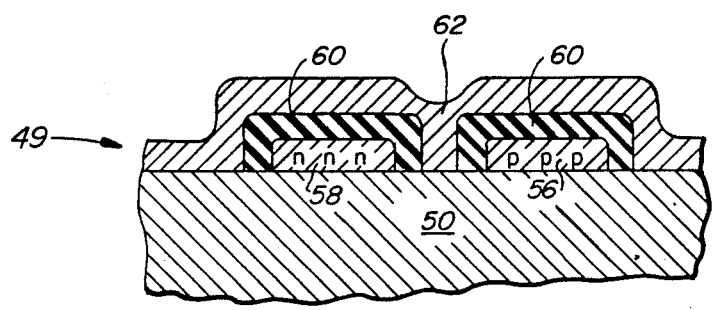
FIG. 11 illustrates a layer of oxide and a coating of polysilicon formed over the wafer.
Figure 12:
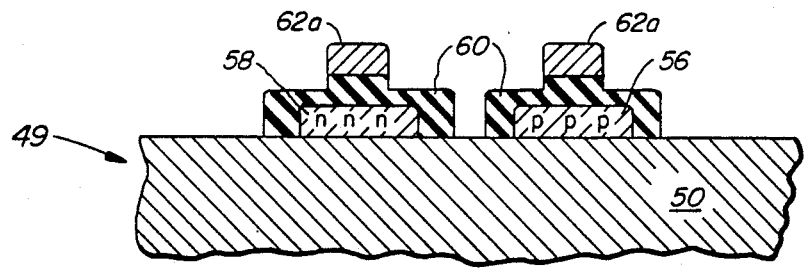

Referring to FIG. 11, a layer of gate oxide 60 is formed over islands 58 and 56 by oxidation. A coating of polysilicon 62 is placed over wafer 49. Polysilicon coating 62 and gate oxide 60 are then selectively etched through photolithographic techniques to create self-aligning polysilicon gates 62a as shown in FIG. 12. However, in the preferred embodiment of wafer 49, a layer of gate oxide 60 approximately 50 nanometers thick is left remaining over islands 56 and 58.

Figure 13:
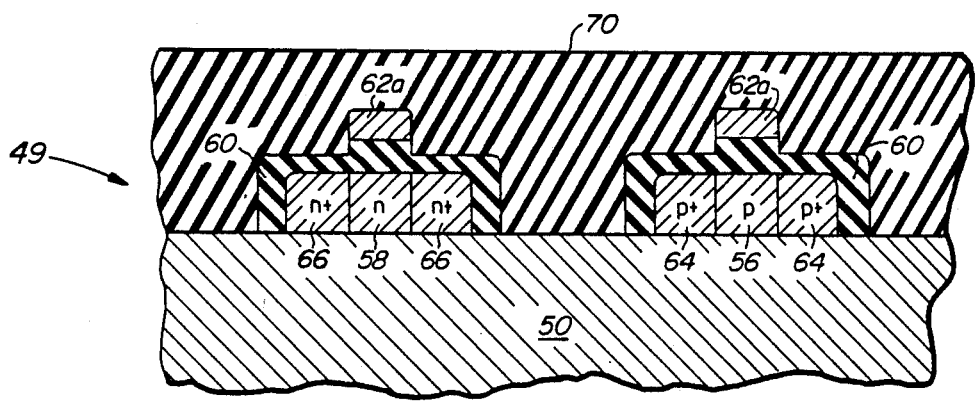
FIG. 13 illustrates a coating of field oxide formed over the wafer.
Figure 14:
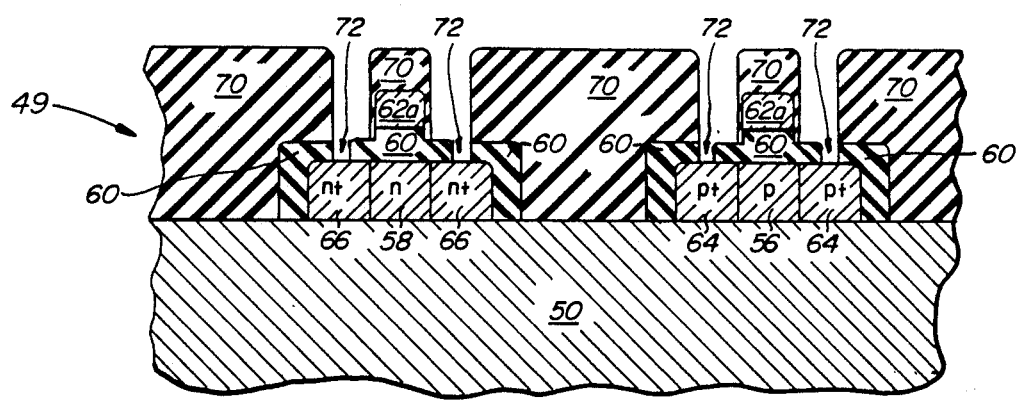
FIG. 14 illustrates the after effects of selective removal of the field oxide layer.
Figure 15:
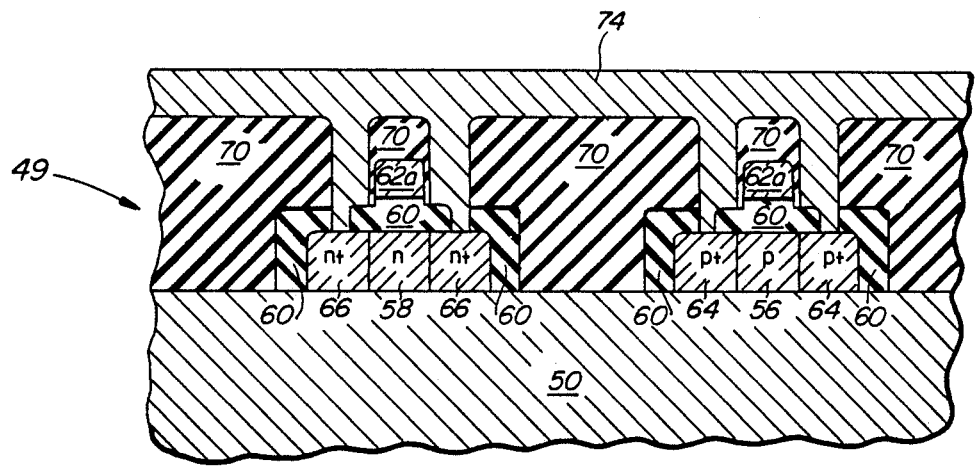
FIG. 15 illustrates a metallization layer formed over the wafer.
Figure 16:
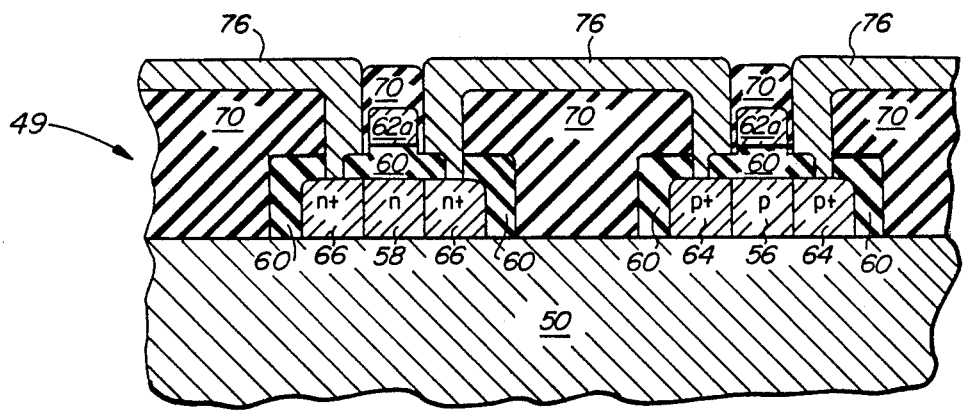
FIG. 16 illustrates a cross-sectional view of the wafer taken along line 16—16 of FIG. 17.

Still referring to FIG. 12, regions 58 are masked. P-type material, such as boron, is implanted through gate oxide 60 on into p-doped islands 56 to create heavily doped p+source and drain regions 64. Regions 56 are masked. N-type dopant such as arsenic is implanted through gate oxide 60 into n-doped islands 58 to create heavily doped n+source and drain regions 66. FIG. 13 depicts a coating of field oxide 70, such as silicon dioxide, formed over wafer 49 by deposition. As shown in FIG.'s 14 and 17, selected regions of field oxide 70 and of gate oxide 60 then are etched to create contact holes 72 which provide access to p+ and n+ regions 64 and 66, respectively, and with polysilicon gates 62a. Metallization layer 74 is formed over wafer 49 and fills contact holes 72, as shown in FIG. 15. Although several conductive metals may be used, metallization layer 74 is preferably formed of aluminum. Regions of metallization layer 74 then are etched away through photolithographic techniques to create metal interconnections 76 as depicted in FIG. 16. A plan view of wafer 49, including transistors 12 and 14 is illustrated in FIG. 17. Optionally, a passivation layer (not shown) may be deposited over wafer 49, except where selected areas of metallization layer 74 are to be in contact with the external world, to protect the underlying circuitry from deterioration from exposure to environmental effects.

Thus, the above-referenced process steps have been described to facilitate an understanding of the manufacture of circuit 10. However, it is to be understood that these process steps may be used to create arrays comprising any number of circuits 10 or 100. The individual process steps described above employ techniques well known to those skilled in this technology and are presented by way of example only. It is to be understood that the scope of the invention is not limited to being manufactured by the processes described herein. The invention may be manufactured by other processes as well.

Obviously, many modifications and variations of the present invention are possible in light of the above teachings. It is therefore to be understood that within the scope of the appended claims, the invention may be practiced otherwise than as specifically described.

We claim:

1. A four quadrant multiplier circuit for providing an output which is proportional to a multiplication product of voltage inputs $V_1$ and $V_2$, comprising:
    an n-channel depletion mode field effect transistor having a gate, source, drain, threshold voltage $V_{Tn}$, and gain constant $K_n$, said drain receiving said voltage input $V_2$, where $V_2 > 0$; and
    a p-channel depletion mode field effect transistor having a gate, source, drain, threshold voltage $V_{Tp}$, and gain constant $K_p$, said drain of said p-channel transistor receiving a voltage input $-V_2$; where said gates of said n- and p-channel transistors are electrically coupled in common to receive said voltage input $V_1$, said source of said n-channel transistor is electrically coupled to said source of said n-channel transistor to provide an output node, and the absolute value of said gain constant $K_n$ is substantially equal to the absolute value of said gain constant $K_p$.

2. The circuit of claim 1 wherein:
    the absolute value of said threshold voltage $V_{Tn}$ is substantially equal to the absolute value of said threshold voltage $V_{Tp}$.

3. A four quadrant multiplier circuit for providing an output which is proportional to a multiplication product of voltage inputs $V_1$ and $V_2$, comprising:
    an n-channel depletion mode field effect transistor having a gate, source, drain, threshold voltage $V_{Tn}$, and gain constant $K_n$, said source receiving said voltage input $V_2$, where $V_2 < 0$; and
    a p-channel depletion mode field effect transistor having a gate, source, drain, $V_{Tp}$, and gain constant $K_p$, said source of said p-channel transistor receiving a voltage input $-V_2$, where said gates of said n- and p-channel transistors are electrically coupled in common to receive said voltage input $V_1$, said drain of said n-channel transistor is electrically coupled to said drain of said p-channel transistor to provide an output node, and the absolute value of said gain constant $K_n$ is substantially equal to the absolute value of said gain constant $K_p$.

4. The circuit of claim 3 wherein:

the absolute value of said threshold voltage $V_{Tn}$ is substantially equal to the absolute value of said threshold voltage $V_{Tp}$.

5. A four quadrant multiplier circuit for providing an output which is proportional to a multiplication product of voltage inputs $V_1$ and $V_2$, comprising:

a first transistor pair comprising:

an n-channel depletion mode field effect transistor having a gate, source, drain, gain constant $K_{n1}$, and threshold voltage $V_{Tn1}$, said drain receiving said voltage input $V_2$, where $V_2 > 0$; and a p-channel depletion mode field effect transistor having a gate, source, drain, gain constant K, and threshold voltage $V_{Tp1}$, said drain of said p-channel transistor receiving a voltage input $-V_2$, where said gates of said n- and p-channel transistors are electrically coupled in common to receive said voltage input $V_1$, said source of said n-channel transistor is electrically coupled to source of said p-channel transistor, and the absolute value of said gain constant $K_{n1}$ is substantially equal to the absolute value of said gain constant $K_{p1}$; and a second transistor pair comprising:

an n-channel depletion mode field effect transistor having a gate, source, drain, gain constant $K_{n2}$ substantially equal to said gain constant $K_{n1}$, and threshold voltage $V_{Tn2}$ substantially equal to said threshold voltage $V_{Tn1}$, said source receiving said voltage input $-V_2$; and a p-channel depletion mode field effect transistor having a gate, source, drain, gain constant $K_{p2}$ substantially equal to said gain constant $K_{p1}$, and threshold voltage $V_{Tp2}$ substantially equal to said threshold voltage $V_{Tp1}$, said source receiving said voltage input $V_2$, where said gates of said n- and p- channel transistors are electrically coupled in common to receive a voltage input $-V_1$ and said drain of said n-channel transistor is electrically coupled to said drain of said p-channel transistor, where said commonly coupled drains of said second transistor pair are electrically coupled to said commonly coupled sources of said first transistor pair to form an output node.

6. The circuit of claim 5 wherein: the absolute value of said threshold voltage $V_{Tn1}$ is substantially equal to the absolute value of said threshold voltage $V_{Tp1}$.

7. A four quadrant multiplier circuit for providing an output which is proportional to a multiplication product of voltage inputs $V_1$ and $V_2$, comprising:

a first transistor pair comprising:

an n-channel depletion mode field effect transistor having a gate, source, drain, gain constant $K_{n1}$, and threshold voltage $V_{Tn1}$, said source receiving said voltage input $V_2$, where $V_2 < 0$; and a p-channel depletion mode field effect transistor having a gate, source, drain, gain constant $K_{p1}$, and a threshold voltage $V_{Tp1}$, said source of said p-channel transistor receiving a voltage input $-V_2$, where said gates of said n- and p-channel transistors are electrically coupled in common to receive said voltage input $V_1$, said drain of said n-channel transistor is electrically coupled to said drain of said p-channel transistor and, the absolute value of said gain constant $K_{n1}$ is substantially equal to the absolute value of said gain constant $K_{p1}$; and a second transistor pair comprising:

an n-channel depletion mode field effect transistor having a gate, source, drain, gain constant $K_{n2}$ substantially equal to said gain constant $K_{n1}$, and threshold voltage $V_{Tn2}$ substantially equal to said threshold voltage $V_{Tn1}$, said drain receiving said voltage input $-V_2$; and a p-channel depletion mode field effect transistor having a gate, source, drain, gain constant $K_{p2}$ substantially equal to said gain constant $K_{p1}$, and threshold voltage $V_{Tp2}$ substantially equal to said threshold voltage $V_{Tp1}$, said drain receiving said voltage input $V_2$; where said gates of said n- and p- channel transistors are electrically coupled in common to receive a voltage input $-V_1$ and said source of said n-channel transistor is electrically coupled to said source of said p-channel transistor, where said commonly sources of said second transistor pair are electrically coupled to said commonly coupled drains of said first transistor pair to form an output node.

8. The circuit of claim 7 wherein:

the absolute value of said threshold voltage $V_{Tn1}$ is substantially equal to the absolute value of said threshold voltage $V_{Tp1}$.

* * * * *